United States Patent
Dobelstein et al.

(10) Patent No.: US 11,557,326 B2
(45) Date of Patent: Jan. 17, 2023

(54) MEMORY POWER COORDINATION

(71) Applicant: Micron Technology, Inc., Boise, ID (US)

(72) Inventors: Kelley D. Dobelstein, Seattle, WA (US); Jason T. Zawodny, Eagle, ID (US); Kyle B. Wheeler, Meridian, ID (US)

(73) Assignee: Micron Techology, Inc., Boise, ID (US)

( * ) Notice: Subject to any disclaimer, the term of this patent is extended or adjusted under 35 U.S.C. 154(b) by 0 days.

(21) Appl. No.: 17/461,084

(22) Filed: Aug. 30, 2021

(65) Prior Publication Data

US 2021/0390988 A1 Dec. 16, 2021

Related U.S. Application Data

(62) Division of application No. 16/657,445, filed on Oct. 18, 2019, now Pat. No. 11,107,510, which is a
(Continued)

(51) Int. Cl.
*G11C 11/4074* (2006.01)
*G11C 7/10* (2006.01)
(Continued)

(52) U.S. Cl.
CPC ............ *G11C 7/1006* (2013.01); *G06F 12/06* (2013.01); *G06F 13/1668* (2013.01);
(Continued)

(58) Field of Classification Search
CPC ....... G11C 7/1006; G11C 7/1015; G11C 8/12; G11C 11/4074; G11C 11/4076;
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Jay W. Radke
(74) *Attorney, Agent, or Firm* — Brooks, Cameron & Huebsch (57) ABSTRACT

The present disclosure includes apparatuses and methods related to bank coordination in a memory device. A number of embodiments include a method comprising concurrently performing a memory operation by a threshold number of memory regions, and executing a command to cause a budget area to perform a power budget operation associated with the memory operation.

20 Claims, 6 Drawing Sheets

Related U.S. Application Data division of application No. 15/090,301, filed on Apr. 4, 2016, now Pat. No. 10,453,502.

(51) Int. Cl.

| | |
|---|---|
| *G11C 11/4076* | (2006.01) |
| *G06F 12/06* | (2006.01) |
| *G11C 8/12* | (2006.01) |
| *G11C 11/408* | (2006.01) |
| *G11C 11/4096* | (2006.01) |
| *G06F 13/16* | (2006.01) |

(52) U.S. Cl.
CPC .............. *G11C 7/1015* (2013.01); *G11C 8/12* (2013.01); *G11C 11/408* (2013.01); *G11C 11/4074* (2013.01); *G11C 11/4076* (2013.01); *G11C 11/4096* (2013.01); *G06F 2212/1028* (2013.01); *G11C 2207/2209* (2013.01); *Y02D 10/00* (2018.01)

(58) Field of Classification Search
CPC .............. G11C 11/408; G11C 11/4096; G11C 2207/2209; G06F 12/06; G06F 13/1668; G06F 2212/1028; Y02D 10/00
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,115,316 A * | 9/2000 | Mori | G11C 7/06 365/205 |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth et al. | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mokhlesi | |
| 8,059,438 B2 | 11/2011 | Chang et al. | |
| 8,095,825 B2 | 1/2012 | Hirotsu et al. | |

(56) References Cited

U.S. PATENT DOCUMENTS

| | | | |
|---|---|---|---|
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,411,523 B2 | 4/2013 | Bains | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,769,318 B2 | 7/2014 | Seroff | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0066671 A1 | 4/2004 | Scheuerlein et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0256628 A1* | 11/2006 | Kim | G11C 11/40618 365/189.09 |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0212386 A1 | 9/2008 | Riho | |
| 2008/0215937 A1 | 9/2008 | Dreibelbis et al. | |
| 2009/0067218 A1 | 3/2009 | Graber | |
| 2009/0103386 A1* | 4/2009 | Rao | G11C 5/14 365/227 |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0258367 A1 | 10/2011 | Tanaka et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134225 A1 | 5/2012 | Chow | |
| 2012/0134226 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0275781 A1 | 10/2013 | Ramage et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029178 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0120987 A1 | 4/2015 | Wheeler | |
| 2015/0134713 A1 | 5/2015 | Wheeler | |
| 2015/0255149 A1 | 9/2015 | Nango et al. | |
| 2015/0270015 A1 | 9/2015 | Murphy et al. | |
| 2015/0279466 A1 | 10/2015 | Manning | |
| 2015/0324290 A1 | 11/2015 | Leidel | |
| 2015/0325272 A1 | 11/2015 | Murphy | |
| 2015/0356009 A1 | 12/2015 | Wheeler et al. | |
| 2015/0356022 A1 | 12/2015 | Leidel et al. | |

(56) References Cited

U.S. PATENT DOCUMENTS

| | | |
|---|---|---|
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0139639 A1 | 5/2016 | Dash et al. |
| 2017/0206031 A1 | 7/2017 | Yin |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

* cited by examiner

MEMORY POWER COORDINATION

PRIORITY INFORMATION

This application is a Divisional of U.S. application Ser. No. 16/657,445, filed Oct. 18, 2019, which issues as U.S. Pat. No. 11,107,510 on Aug. 31, 2021, which is a Divisional of U.S. application Ser. No. 15/090,301, filed Apr. 4, 2016, which issued as U.S. Pat. No. 10,453,502 on Oct. 22, 2019, the contents of which are included herein by reference.

TECHNICAL FIELD

The present disclosure relates generally to semiconductor memory and methods, and more particularly, to apparatuses and methods related to memory power coordination.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

DETAILED DESCRIPTION

The present disclosure includes apparatuses and methods related to memory power coordination. A number of embodiments of the present disclosure include a method of memory power coordination including concurrently performing a memory operation by a threshold number of memory regions and executing a command to cause a budget area to perform a power budget operation associated with the memory operation.

A number of embodiments include an apparatus comprising a memory comprising memory regions each comprising memory cells, a budget area configured to store a threshold value corresponding to at least one of the memory regions to be enabled, and a controller configured to control access to a second one of the memory regions beyond the at least one of the memory regions corresponding to the threshold value. In at least one embodiment, the controller can be configured to execute a command to cause the budget area to perform a power budget operation; based at least in part on a number of memory regions accessed by a bank arbiter.

A number of embodiments of the present disclosure can facilitate memory power coordination in a more efficient manner as compared to previous approaches. For example, embodiments include actively limiting power consumption based on a configurable threshold amount of power that is available to be consumed. For example, a number of memory regions that can perform operations concurrently can be limited for memory power coordination.

In at least one embodiment, most data should vary between different memory regions (e.g., banks and subarrays) within a processor-in-memory (PIM), e.g., a PIM dynamic random access memory (DRAM) implementation. For example, data can vary between different banks and subarrays without being bused outside the banks and/or subarrays. As used herein, a "memory region" is a storage unit or storage units configured to store logical or physical data in a computing system. Examples of memory regions include banks, arrays, subarrays, etc., that may be configured to store data associated with the computing system. Examples of computing systems that can include memory regions include DRAM (e.g., PIM DRAM), SDRAM, etc. Although some embodiments described herein make specific reference to banks and/or subarrays, it will be appreciated that memory operations performed using the banks and/or subarrays may similarly be performed using memory regions associated with a computing system.

Embodiments disclosed herein include mechanisms on a PIM DRAM that can actively control, e.g., reduce, mitigate, and/or minimize power consumption. For example, embodiments include mechanisms on a PIM that can actively limit at least a worst case scenario power consumption. In some embodiments, such mechanisms can actively limit power consumption based at least in part on a configurable power threshold.

Embodiments herein disclose a PIM DRAM that can implement a selectable capability to limit power consumption while data is written to multiple banks in parallel, e.g., simultaneously, to avoid the need to perform multiple write sequences to achieve the same effect, and to provide a limit in power consumption. For example, apparatuses and methods described herein can facilitate limiting power consumption while writing data to a plurality of locations between multiple banks and subarrays on the same memory device simultaneously. Depending on the algorithms being executed on a PIM DRAM device, for example, selectively limiting power to a plurality of banks while data is written to a plurality of banks in a memory device and/or selectively limiting power to a plurality of banks and/or subarrays in a PIM DRAM device, disclosed techniques can save significant time in setting up the environment for executing blocks of PIM operations. Such techniques can decrease the effective power consumption of a PIM DRAM device.

In at least one embodiment a bank arbiter to a memory device can implement a series of budget areas (e.g., registers, power budget registers, etc.) to set the memory regions (e.g., banks and/or subarrays) to be subjected to power limitation. In at least one embodiment, a command protocol for the dynamic random access memory (DRAM) part is augmented to indicate that writes, or masked writes, are being done in a manner that affects power limitation. As used herein, a "budget area" is hardware that is configured to store and/or write bits of information. A budget area may be configured to store, read, and/or write bits of information simultaneously. Examples of budget areas include registers (e.g., power budget registers, subarray budget registers, etc.). Although some embodiments described herein make specific reference to power budget registers and/or subarray budget registers, it will be appreciated that operations carried out using a power budget register and/or a subarray budget register may be similarly performed using a budget area.

Previous approaches to bank power coordination can suffer from shortcomings such as insufficient power limitation and/or brownout. As such, bank power coordination can be cumbersome and/or unrealistic to, for example, alter power limitation in PIM DRAM devices in accordance with previous approaches.

A number of embodiments of the present disclosure can provide improved parallelism and/or reduced power consumption in association with performing bank and/or subarray operations as compared to previous systems such as previous PIM systems and systems having an external processor (e.g., a processing resource located external from a memory array, such as on a separate integrated circuit chip). For example, a number of embodiments can provide for bank power coordination when performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc. As used herein, in some embodiments, bank and/or subarray operations are intended to include PIM operations, e.g., PIM DRAM operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1A:
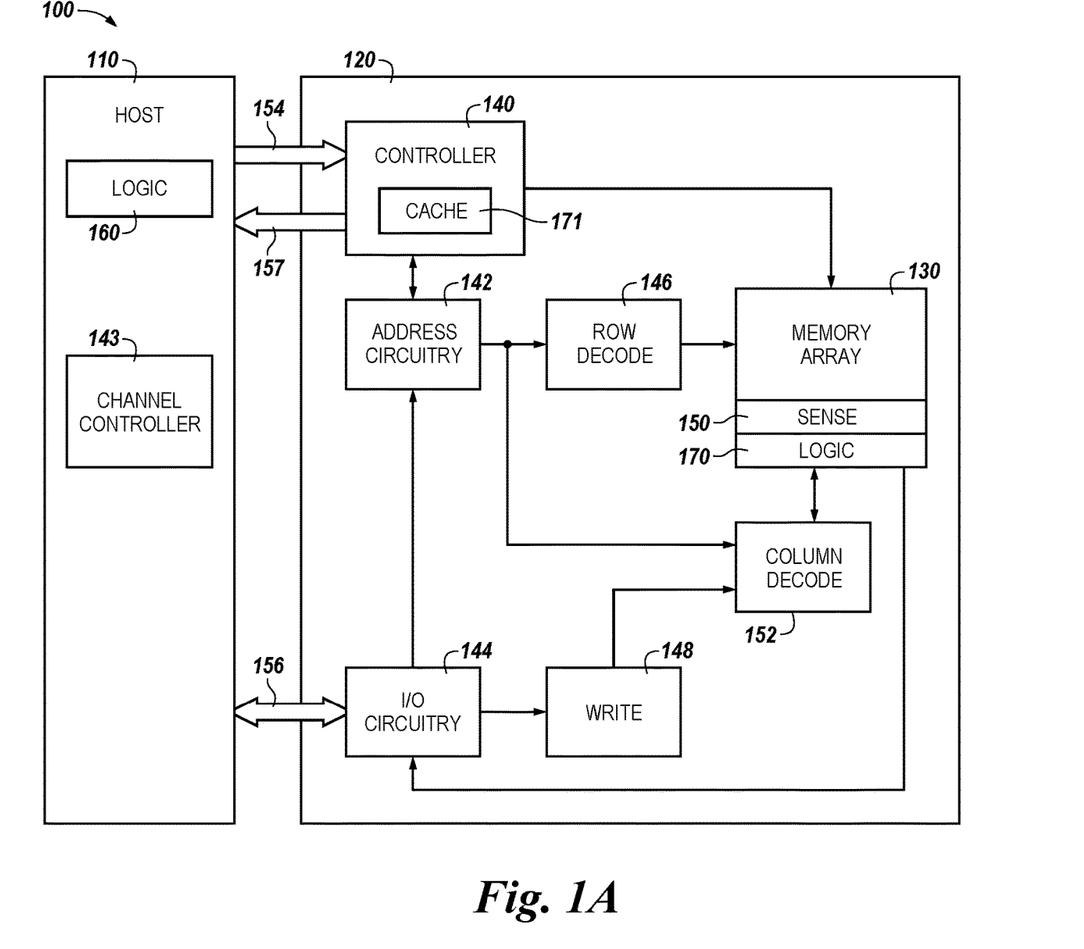
FIG. 1A is a block diagram of an apparatus in the form of a computing system including a memory device in accordance with a number of embodiments of the present disclosure.

FIG. 1A is a block diagram of an apparatus in the form of a computing system 100 including a memory device 120 in accordance with a number of embodiments of the present disclosure. As used herein, a memory device 120, controller 140, channel controller 143, bank arbiter 145 (shown in FIG. 1B), memory array 130, sensing circuitry 150, logic circuitry 170, and/or cache 171 might also be separately considered an "apparatus."

Figure 1B:
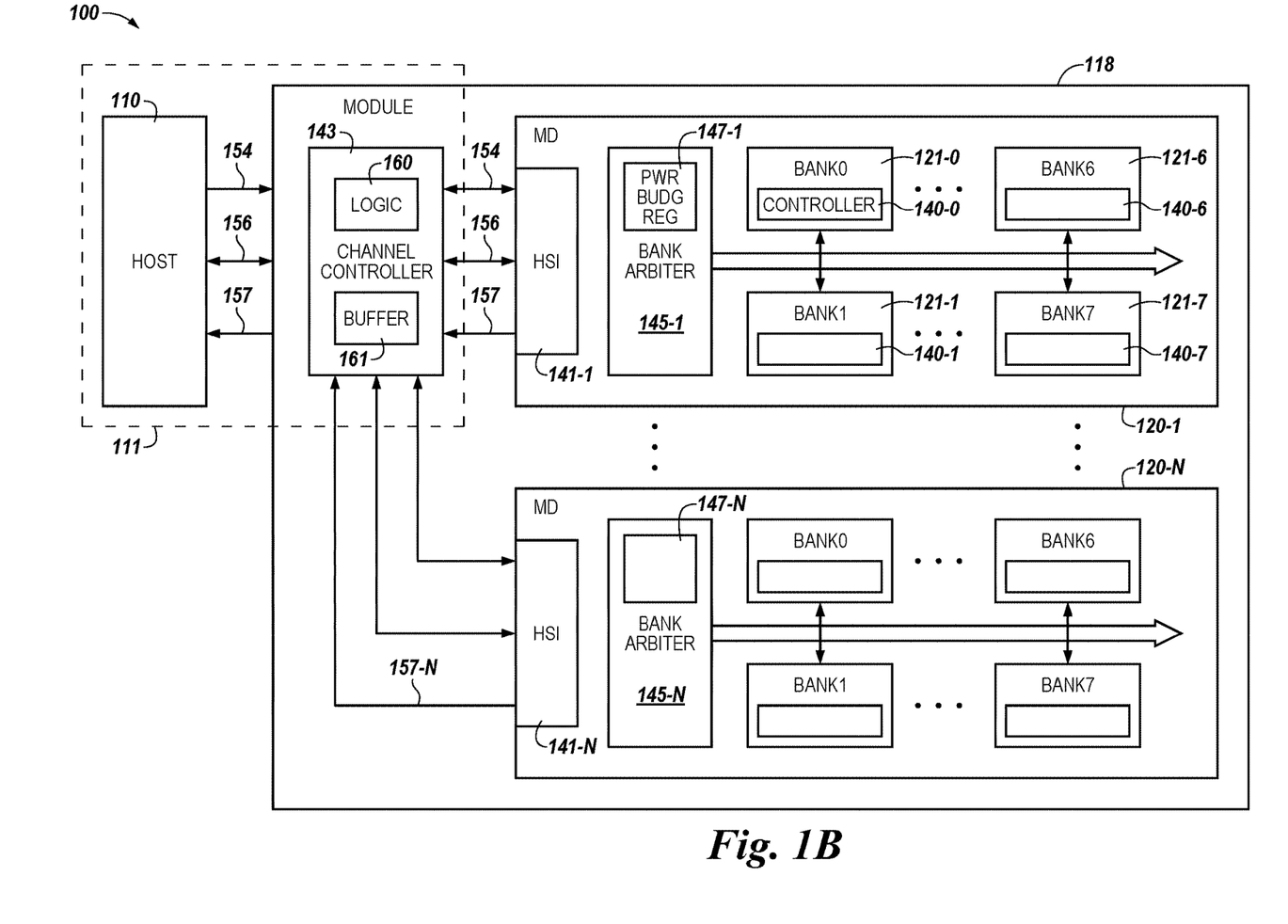
FIG. 1B is another block diagram of an apparatus in the form of a computing system including a memory device in accordance with a number of embodiments of the present disclosure.

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the controller 140 on the memory device 120 to a channel controller 143, through a high speed interface (HSI) 141 (shown in FIG. 1B) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine (e.g., hardware and/or firmware in the form of an application specific integrated circuit (ASIC)), a sequencer, or some other type of controller. In some embodiments, the controller 140 can include cache 171. The controller 140 can control an amount of power available to banks and/or subarrays by controlling a number of banks and/or subarrays that can perform an operation at a given time and/or within a given timeframe.

For example, as described in more detail herein, controller 140 (shown in FIG. 1B) can be in communication with a bank arbiter and/or power budget register to allow only a certain number of subarrays and/or banks (shown in FIGS. 1C and 1D) to be accessed to perform a memory operation concurrently or within a certain timeframe. As used herein, a "memory operation" includes logical operations and/or PIM operations (e.g., logical operations, shift operations, and/or rotate operations within a PIM implementation).

Examples of the sensing circuitry 150 are described further below, e.g., in FIG. 2. For instance, in a number of embodiments, the sensing circuitry 150 can comprise a number of sense amplifiers and a number of compute components, which may serve as, and be referred to herein as an accumulator, and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via an address and control (A/C) bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-band (OOB) bus 157 associated with a high speed interface (HSI) 141, described more herein, that is configured to report status, exception and other data information to the channel controller 143 to exchange with the host 110.

As shown in FIG. 1B, the channel controller 143 can receive the status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a controller 140 and other components, including an array of memory cells 130 and sensing circuitry 150, peripheral logic 170, etc., as described in connection with FIG. 1A.

In some embodiments, the respective controller 140-0, 140-1, . . . , 140-N can be configured to control operations performed on the bank 121-0, . . . , 121-7 that is associated with. The bank arbiter 145-1 is configured to control which bank 121-0, . . . , 121-7 is to be enabled and/or which banks are to perform concurrent operations. For example, the banks 121-0, . . . , 121-7 can be configured to operate independently of one another based on a command from the bank arbiter 145-1. The command from the bank arbiter 145-1 may be based, at least in part, on information received from the budget area (e.g., power budget register 147-1).

Each of the plurality of banks, e.g., Bank 0, . . . , Bank 7, in the plurality of memory devices 120-1, . . . , 120-N can include address circuitry 142 to latch address signals provided over a data bus 156 (e.g., an I/O bus) through I/O circuitry 144. Status and/or exception information can be provided from the controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers 161 to store program instructions and can include logic 160 to allocate a plurality of locations, e.g., subarrays, in the arrays of each respective bank to store bank commands, and arguments, e.g., PIM commands, for the various banks associated with to operation of each of the plurality of memory devices 120-1, . . . , 120-N. The channel controller 143 can dispatch commands, e.g., PIM commands, to the plurality of memory devices 120-1, . . . , 120-N to store those program instructions within a given bank of a memory device.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. And, as above, the controller 140 can be a state machine, a sequencer, or some other type of controller. That is, the controller 140 can control a number of banks and/or subarrays that can perform operations concurrently or within a given timeframe, thereby limiting an amount of power consumed in performing such operations in an array, e.g., memory array 130.

According to embodiments, the controller 140 is configured to set a series of budget areas (e.g., power budget registers 147) in a bank arbiter 145 and/or in logic circuitry 170. The controller 140 and/or the bank arbiter 145 are configured to facilitate bank power coordination to limit power consumption, for example.

Figure 1C:
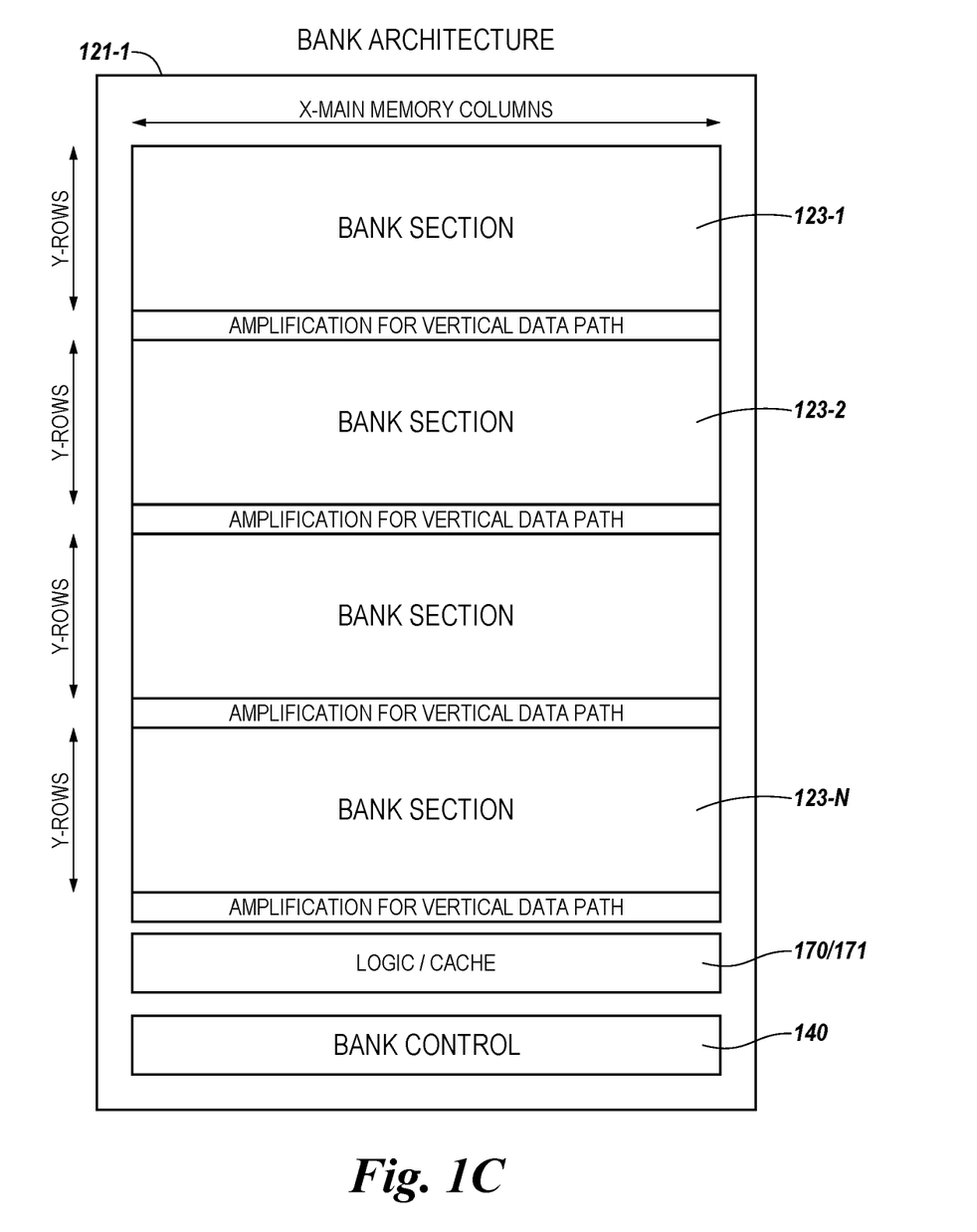
FIG. 1C is a block diagram of a bank to a memory device in accordance with a number of embodiments of the present disclosure.

FIG. 1C is a block diagram of a bank 121-1 to a memory device in accordance with a number of embodiments of the present disclosure. That is bank 121-1 can represent an example bank to a memory device such as Bank 0, . . . , Bank 7 (121-0, . . . , 121-7) shown in FIG. 1B. As shown in FIG. 1C, a bank architecture can include a plurality of main memory columns (shown horizontally as X), e.g., 16,384 columns in an example DRAM bank. Additionally, the bank 121-1 may be divided up into bank sections, 123-1, 123-2, . . . , 123-N, separated by amplification regions for a data path. Each of the of the bank sections 123-1, . . . , 123-N can include a plurality of rows (shown vertically as Y), e.g., each section may include 16,384 rows in an example DRAM bank. Example embodiments are not limited to the example horizontal and/or vertical orientation of columns and rows described here or the example numbers thereof.

As shown in FIG. 1C, the bank architecture can include logic circuitry 170 (or 170/171), including extra sense amp stripes that may be used for registers, cache, and data buffering 171, that are coupled to the bank sections 123-1, . . . , 123-N. In some embodiments, the logic circuitry 170 can represent another example of the cache 171 associated with the controller 140 or the logic 170 associated with the sensing circuitry 150 and array 130 as shown in FIG. 1A. Further, as shown in FIG. 1C, the bank architecture can be associated with bank control, e.g., controller 140. The bank control shown in FIG. 1C can, in example, represent at least a portion of the functionality embodied by and contained in the controller 140 shown in FIGS. 1A and 1B.

Figure 1D:
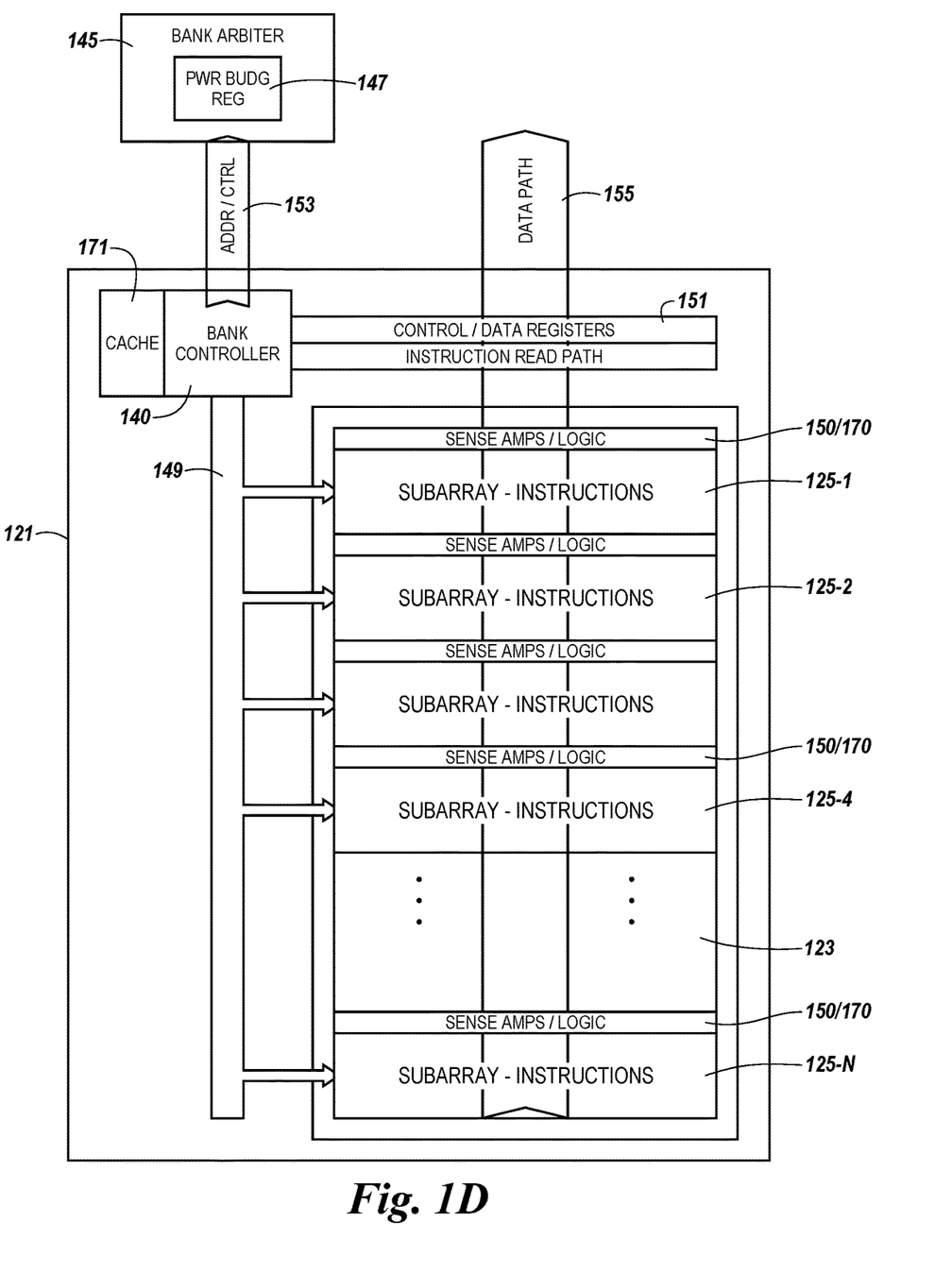
FIG. 1D is another block diagram of a bank to a memory device in accordance with a number of embodiments of the present disclosure.

FIG. 1D is another block diagram of a bank 121 to a memory device in accordance with a number of embodiments of the present disclosure. That is, bank 121 can represent an example bank to a memory device such as Bank 0, . . . , Bank 7 (121-0, . . . , 121-7) shown in FIG. 1B. As shown in FIG. 1D, a bank architecture can include an address/control (A/C) path, e.g., bus, 153 coupled a bank arbiter 145. Again, the bank arbiter 145 shown in FIG. 1D can, in at least one example, represent at least a portion of the functionality embodied by and contained in the memory controller 140 shown in FIGS. 1A and 1B. Also, as shown in FIG. 1D, a bank architecture can include a data path, e.g., bus, 155, coupled to a plurality of control/data registers in an instruction and/or data, e.g., program instructions (PIM commands), read path and coupled to a plurality of bank sections, e.g., bank section 123, in a particular bank 121.

Figure 2:
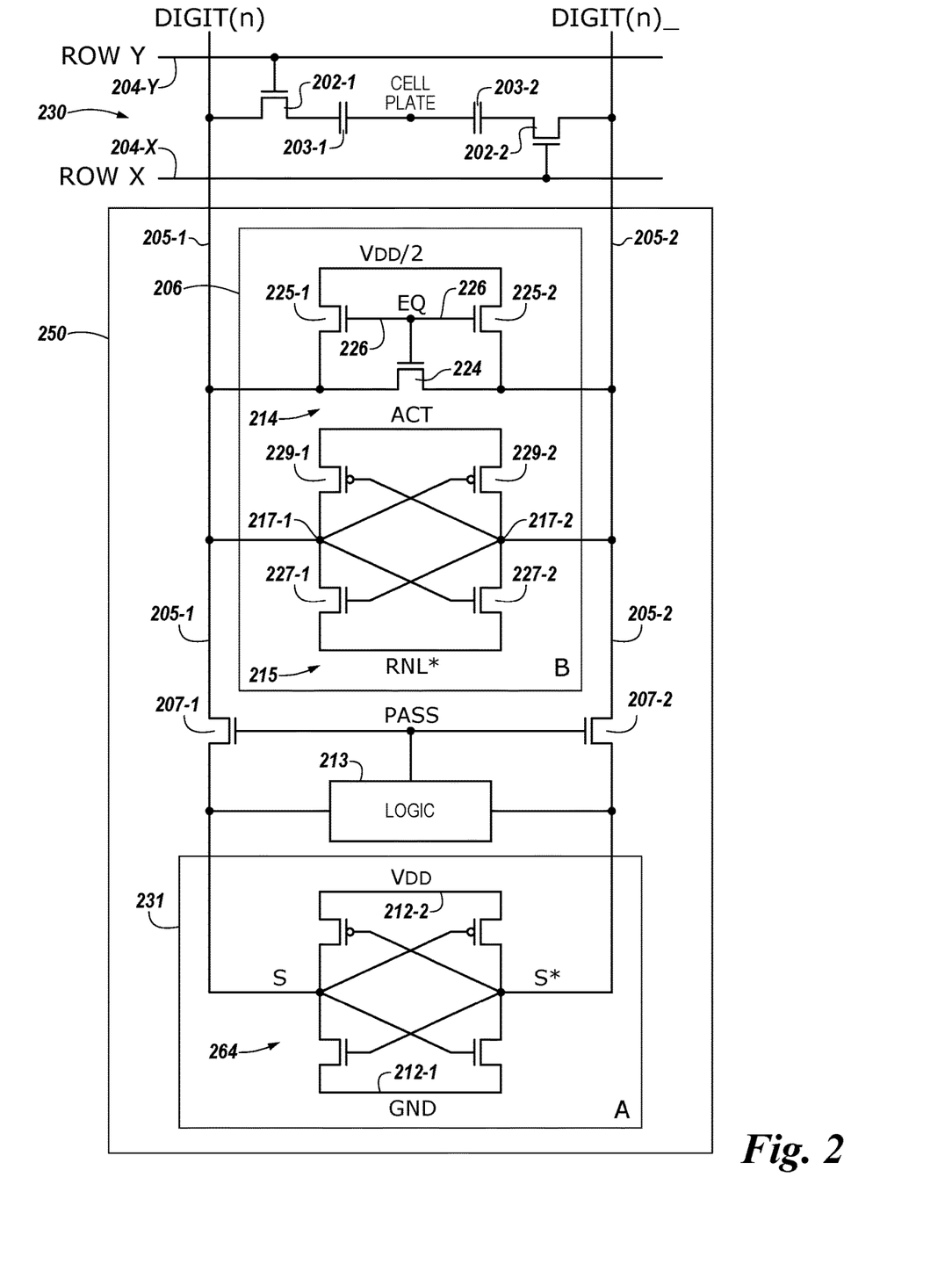
FIG. 2 is a schematic diagram illustrating a portion of a memory array including sensing circuitry in accordance with a number of embodiments of the present disclosure.

As shown in FIG. 1D, a bank section 123 can be further subdivided into a plurality of sub-arrays (or subarrays) 125-1, 125-2, . . . , 125-N again separated by a plurality of sensing circuitry and logic circuitry 150/170 as shown in FIG. 1A and described further in connection with FIG. 2. In one example, a bank section 123 may be divided into sixteen (16) subarrays. However, embodiments are not limited to this example number.

FIG. 1D illustrates a register (e.g., a power budget register) 147 associated with the bank arbiter 145 and coupled again, the bank to each of the subarrays 125-1, . . . , 125-N in the bank section 123. In at least one embodiment, the plurality of subarrays 125-1, . . . , 125-N and/or portions of the plurality of subarrays may be referred to as a plurality of locations for storing program instructions, e.g., PIM commands, and/or constant data, e.g., data to set up PIM calculations, to a bank 123 in a memory device.

According to embodiments of the present disclosure, the bank arbiter 145 shown in FIG. 1D is configured for bank power coordination on a memory device 120. Alternatively, bank power consumption may be provided by power budget register 147.

Bank power coordination on the memory device 120 includes determining and/or selecting a threshold number of banks and/or subarrays 125-1, . . . , 125-N, and/or bank sections 123-1, . . . , 123-N that can perform an operation concurrently. For example, a memory device may have 64 banks able to perform an operation. In this example, if the threshold number of banks that can concurrently perform an operation is 16, then only 16 of the 64 banks can perform concurrent operations. In at least one embodiment, a counter associated with the threshold number of banks that can perform a concurrent operation is decremented for each bank that is performing an operation, and is incremented each time a bank completes an operation.

According to embodiments, signals received from the bank arbiter 145 (or signals received external to the bank arbiter 145, e.g., from host 110) are used to set a budget area 147 (e.g., a power budget register 147). In some embodiments, the bank arbiter 145 is configured to limit an amount of power available to the banks 121 and/or subarrays 125. For example, the bank arbiter 145 is configured to allocate a number of banks e.g., banks 121-0, . . . , 121-7, shown in FIGS. 1B, 1C and 1D, subarrays, e.g., subarrays 125-1, . . . , 125-N, shown in FIG. 1D, and/or bank sections, e.g., bank sections 123-1, . . . , 123-N, shown in FIGS. 1C and 1D that can perform operations concurrently. The controller 140, bank arbiter 145, and/or register 147, include logic in the form of hardware circuitry and/or application specific integrated circuitry (ASIC). The controller 140, bank arbiter 145, and/or register 147 can thus control a threshold amount of power available to the number of banks e.g., banks 121-0, . . . , 121-7, shown in FIGS. 1B, 1C and 1D, and/or subarrays, e.g., subarrays 125-1, . . . , 125-N, shown in FIG. 1D, that can perform operations concurrently. In some embodiments, the memory regions (e.g., banks 121-0, . . . , 121-7 and/or subarrays 125-1, . . . , 125-N) are configured to be independently enabled or disabled. For example, each memory region can be enabled or disabled independently of the other memory regions.

According to embodiments, the number of banks 121 and/or subarrays 125 that can concurrently perform operations can be pre-resolved, e.g. by a programmer and/or provided to the host 110 and/or channel controller 143, and are received from a channel controller to a bank arbiter 145 in each of a plurality of memory devices 120-1, . . . , 120-N, as shown in FIG. 1B. As shown in FIG. 1D, in at least one embodiment, the bank arbiter 145 and/or register 147 is configured to use DRAM protocol and DRAM logical and electrical interfaces to control the number of banks 121 and/or subarrays 125 that can perform concurrent operations.

In at least one embodiment the bank arbiter 145 is configured to limit power consumption of the memory device 120 in a plurality of subarrays in a plurality of banks 121-0, . . . , 121-N (Bank 0, Bank 1, . . . , Bank N) using the DRAM write path. For example, a plurality of banks 121-0, . . . , 121-N (Bank 0, Bank 1, . . . , Bank N) are shown coupled to a memory device 120. Each respective bank 121-0, . . . , 121-N can include a plurality of subarrays, e.g., 125-1, . . . , 125-N and/or portions of subarrays for Bank 0, 126-0, . . . , 126-N for Bank 1, and 127-0, . . . , 127-N for Bank N. Embodiments are not so limited; however, and the host 110, controller 140, and/or channel controller 143 can be configured to limit power consumption of the memory device 120 in a plurality of subarrays 125 and/or portions of the plurality of subarrays in the plurality of banks 121-0, . . . , 121-N (Bank 0, Bank 1, . . . , Bank N).

Operations of a plurality of banks 121 and/or subarrays 125 can be controlled by bank arbiter 145 and/or register 147. The bank arbiter 145 can communicate with the register 147 set to control a number of the plurality of banks (e.g., banks 121-0, . . . , 121-N illustrated in FIG. 1B) to perform operations in parallel and for the plurality of subarrays, e.g., 125-0, . . . , 125-N for Bank 0, etc. In at least one embodiment, the subarrays and/or portions of subarrays are different among the select ones of the plurality of banks.

Hence, bank power coordination can be provided via a bank arbiter 145 and/or register 147 to each memory device 120 in a plurality of memory devices 120-1, . . . , 120-N. In at least one embodiment, a series of registers (e.g., power budget register(s) 147) can be set to limit a number of banks of the plurality of banks 121-0, . . . , 121-N in each memory device 120 that can perform an operation concurrently.

In some embodiments, as seen in FIG. 1B, the array of memory cells (130 in FIG. 1A) includes a plurality of banks of memory cells 120-1, . . . , 120-N and the memory device 120 includes a bank arbiter 145 coupled to each of the plurality of banks 120-1, . . . , 120-N. In such embodiments, each bank arbiter 145 is configured to control a number of banks 120-1, . . . , 120-N and/or subarrays 125-1, . . . , 125-N that can perform concurrent operations. In some embodiments, the controller 140 can then store instructions in the received instruction block and/or in the received constant data to a plurality of locations for the particular bank as allocated by the host 110 and/or channel controller 143. That is, the host 110 and/or channel controller 143 is configured to address translate the plurality of locations for the bank arbiter 145 to assign to banks of the memory device 120. In at least one embodiment, as shown in FIG. 1D, the plurality of locations includes a number of subarrays 125-1, . . . , 125-N in the DRAM banks 121-1, . . . , 121-7 and/or portions of subarrays.

In at least one embodiment, a memory device 120 can be configured to couple to a host 110 via a data bus 156 and a control bus 154. A bank (e.g., 121-0) can include a plurality of bank sections 123-0, . . . , 123-N and a plurality of subarrays 125-1, . . . , 125-N of memory cells 130, wherein a respective subarray (e.g., 125-1) of the plurality of subarrays 125 is coupled to a respective bank (e.g., 121-0) of the plurality of banks 121-0, . . . , 121-N. Some embodiments can include sensing circuitry coupled to the plurality of subarrays 125 via a plurality of columns of the memory cells 130, the sensing circuitry including a sense amplifier and a compute component coupled to each of the columns. Some embodiments can further include a bank arbiter 145-1 including a power budget register 147 coupled to the plurality of subarrays 125, and the power budget register 147 can be configured to associated a threshold number of available concurrent data transfers with the plurality of banks 121-0, . . . , 121-N.

Some embodiments can include a channel controller 143 coupled to the bank arbiter 145-1, wherein the channel controller 143 is configured to direct a data transfer associated with at least one bank (e.g., 121-0) of the plurality of banks 121-0, . . . , 121-N based on the threshold number of available concurrent data transfers. In at least one embodiment, the host 110 is configured to control the timing of an operation of at least one bank (e.g., 121-0) of the plurality of banks 121-0, . . . , 121-N based at least in part on a priority of the operation being performed by the at least one bank (e.g., 121-0). In some embodiments, the threshold number of available concurrent data transfers can be a non-zero number between 1 and 8; however, examples are not so limited and the threshold number can be more than 8.

In at least one embodiment, the bank arbiter 145-1 can include counter (e.g., 349 illustrated in FIG. 3) coupled to the power budget register 147. The counter (e.g., 349 illustrated in FIG. 3) can be configured to decrement the threshold number of available concurrent data transfers in response to a bank among the plurality of banks executing an operation, and/or increment the threshold of available concurrent data transfers in response to a bank among the plurality of banks completing the operation. For example, as described in more detail in connection with FIG. 3, the counter (e.g., 349 illustrated in FIG. 3) can be used to ensure that the power budget is not exceeded.

In some embodiments, a plurality of controllers 140-0, . . . , 140-N can be coupled to the plurality of banks 121-0, . . . , 121-N, and a respective controller (e.g., 140-0) among the plurality of controllers 140-0, . . . , 140-N is coupled to a respective bank (e.g., 121-0) among the plurality of banks 121-0, . . . , 121-N. In at least one embodiment, a plurality of subarray budget registers (e.g., 359-0, . . . , 359-7 illustrated in FIG. 3) are coupled to the plurality of controllers 140-0, . . . , 140-N, and a respective subarray budget register among the plurality of subarray budget registers can be coupled to respective sequencers among the plurality of controllers 140-0, . . . , 140-N. In some embodiments, the respective subarray budget registers can be configured to communicate power budget information associated with the respective bank among the plurality of banks to the power budget register, as described in more detail in connection with FIG. 3.

In some embodiments, memory device 120 can include sensing circuitry 150. Examples of the sensing circuitry 150 are described further below (e.g., in FIG. 2). For instance, in a number of embodiments, the sensing circuitry 150 can include a number of sense amplifiers and corresponding compute components, which may serve as an accumulator and can be used to perform logical operations (e.g., on data associated with complementary sense lines). The sensing circuitry 150 can be used to reverse data stored in memory (e.g., in array 130) in accordance with embodiments described herein.

In a number of embodiments, the sensing circuitry 150 can also be used to perform logical operations (e.g., logical functions such as AND, OR, NOT, NOR, NAND, XOR, etc.) using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral logic 170, which can include an additional number of sense amplifiers, can be coupled to the sensing circuitry 150. The sensing circuitry 150 and the peripheral logic 170 can cooperate in performing logical operations and/or in reversing data stored in memory, according to a number of embodiments described herein.

FIG. 2 is a schematic diagram illustrating a portion of a memory array 230 including sensing circuitry in accordance with a number of embodiments of the present disclosure. The sensing component 250 represents one of a number of sensing components that can correspond to sensing circuitry 150 shown in FIG. 1.

In the example shown in FIG. 2, the memory array 230 is a DRAM array of 1T1C (one transistor one capacitor)

memory cells in which a transistor serves as the access device and a capacitor serves as the storage element; although other embodiments of configurations can be used (e.g., 2T2C with two transistors and two capacitors per memory cell). In this example, a first memory cell comprises transistor 202-1 and capacitor 203-1, and a second memory cell comprises transistor 202-2 and capacitor 203-2, etc. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by access lines 204-X (Row X), 204-Y (Row Y), etc., and columns coupled by pairs of complementary sense lines (e.g., digit lines 205-1 labelled DIGIT(n) and 205-2 labelled DIGIT(n) in FIG. 2). Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 202-1 is coupled to digit line 205-1, a second source/drain region of transistor 202-1 is coupled to capacitor 203-1, and a gate of transistor 202-1 is coupled to word line 204-Y. A first source/drain region of transistor 202-2 is coupled to digit line 205-2, a second source/drain region of transistor 202-2 is coupled to capacitor 203-2, and a gate of transistor 202-2 is coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The digit lines 205-1 and 205-2 of memory array 230 are coupled to sensing component 250 in accordance with a number of embodiments of the present disclosure. In this example, the sensing component 250 comprises a sense amplifier 206 and a compute component 231 corresponding to a respective column of memory cells (e.g., coupled to a respective pair of complementary digit lines). The sense amplifier 206 is coupled to the pair of complementary digit lines 205-1 and 205-2. The compute component 231 is coupled to the sense amplifier 206 via pass gates 207-1 and 207-2. The gates of the pass gates 207-1 and 207-2 can be coupled to selection logic 213.

The selection logic 213 can include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The selection logic 213 can be coupled to the pair of complementary digit lines 205-1 and 205-2 and configured to perform logical operations on data stored in array 230. For instance, the selection logic 213 can be configured to control continuity of (e.g., turn on/turn off) pass gates 207-1 and 207-2 based on a selected logical operation that is being performed.

The sense amplifier 206 can be operated to determine a data value (e.g., logic state) stored in a selected memory cell. The sense amplifier 206 can comprise a cross coupled latch 215 (e.g., gates of a pair of transistors, such as n-channel transistors 227-1 and 227-2 are cross coupled with the gates of another pair of transistors, such as p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of digit lines 205-1 or 205-2. An ACT signal and an RNL* signal can be driven low to enable (e.g., fire) the sense amplifier 206. The digit line 205-1 or 205-2 having the lower voltage will turn on one of the transistors 229-1 or 229-2 to a greater extent than the other of transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage Vcc through a source transistor, and the other digit line 205-1 or 205-2 is driven to the voltage of the reference voltage (e.g., ground) through a sink transistor. Therefore, the cross coupled transistors 227-1 and 227-2 and transistors 229-1 and 229-2 serve as a sense amplifier pair, which amplify the differential voltage on the digit lines 205-1 and 205-2 and operate to latch a data value sensed from the selected memory cell.

Embodiments are not limited to the sensing component configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

As described further below, the sensing component 250 can be one of a plurality of sensing components selectively coupled to a shared I/O line. As such, the sensing component 250 can be used in association with reversing data stored in memory in accordance with a number of embodiments of the present disclosure.

In this example, the sense amplifier 206 includes equilibration circuitry 214, which can be configured to equilibrate the digit lines 205-1 and 205-2. The equilibration circuitry 214 comprises a transistor 224 coupled between digit lines 205-1 and 205-2. The equilibration circuitry 214 also comprises transistors 225-1 and 225-2 each having a first source/drain region coupled to an equilibration voltage (e.g., VDD/2), where VDD is a supply voltage associated with the array. A second source/drain region of transistor 225-1 is coupled to digit line 205-1, and a second source/drain region of transistor 225-2 is coupled to digit line 205-2. Gates of transistors 224, 225-1, and 225-2 can be coupled together and to an equilibration (EQ) control signal line 226. As such, activating EQ enables the transistors 224, 225-1, and 225-2, which effectively shorts digit lines 205-1 and 205-2 together and to the equilibration voltage (e.g., VDD/2). Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., VDD), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

Figure 3:
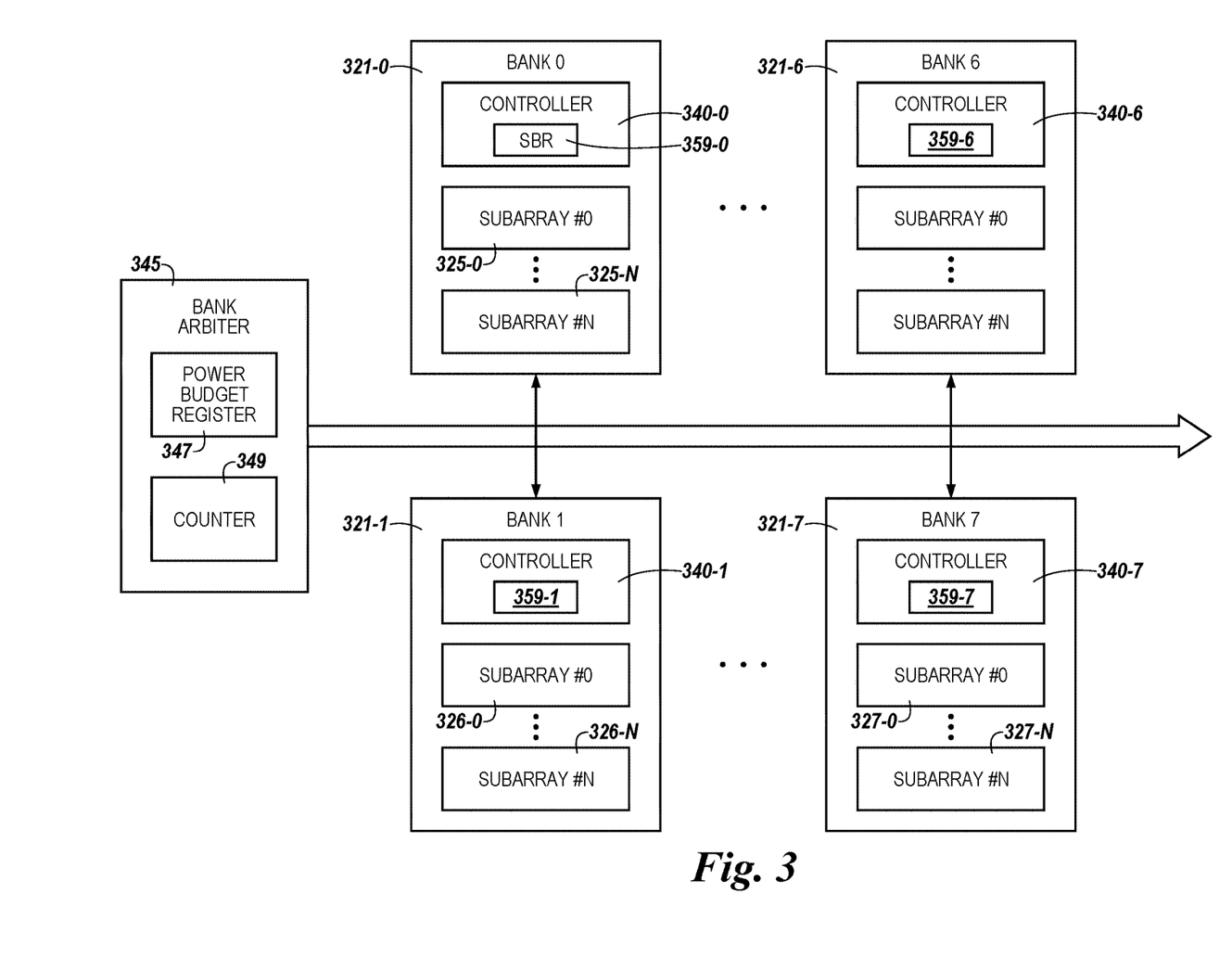
FIG. 3 is another block diagram of an apparatus in the form of a computing system including a memory device in accordance with a number of embodiments of the present disclosure.

FIG. 3 is another block diagram of an apparatus in the form of a computing system including a memory device in accordance with a number of embodiments of the present disclosure. In the example of FIG. 3, a bank arbiter 345, including a power budget register 347 and counter 349, can be configured for bank power coordination on a memory device. In at least one embodiment, each respective bank 321-0, . . . , 321-7 can include 64 subarrays 325-0, . . . , 325-N, 326-0, . . . , 326-N, 327-0, . . . , 327-N. Embodiments are not so limited; however, and the respective banks 321-0, . . . , 321-7 can include more or fewer than 64 subarrays 325-0, . . . , 325-N, 326-0, . . . , 326-N, 327-0, . . . , 327-N.

As illustrated in FIG. 3, the bank arbiter 345 can be in communication with a plurality of banks 321-0, . . . , 321-N. Each bank (e.g., 320-0) of the plurality of banks 321-0, . . . , 321-N can include a respective controller 340, subarray budget register 359, and/or a plurality of subarrays 325, 326, 327, etc. In at least one embodiment, the subarray budget registers 359-0, . . . , 359-N can be in communication with the power budget register 347 and can communicate power budget information regarding the subarrays 325, 326, 327 associated with a respective bank 321-0, . . . , 321-N to the power budget register 347. For example, each respective subarray budget register 359-0, . . . , 359-7 can communicate power information (e.g., how much power an operation or operations will consume, how much power is available to perform an operation on a subarrays or plurality of subarrays, etc.) to the power budget register 347. In this regard, the power budget register 347 can act as a shared register and can control a number of banks 321 and/or subarrays 325, 326, 327 that can perform concurrent operations at a given time or within a given time period.

In at least one embodiment, the power budget register 347 can control a maximum number of banks 321-0, . . . , 321-N that can perform an operation concurrently. In the example of FIG. 3, there are eight banks (e.g., BANK #0 through BANK #7). As a non-limiting example, the power budget register 347 can be configured such that no more than four banks can perform an operation concurrently based on the counter 349. For example, if the power budget register 347 is configured to allow no more than four banks to perform concurrent operations, and three banks are ready to perform their respective operations, the power budget register 347 will allow the three banks to perform their respective operations. However, if five banks are ready to perform their respective operations, the power budget register 347 can deny the respective operations to the banks.

In at least one embodiment, bank power coordination can be achieved via an apparatus comprising a memory device, a plurality of banks 321-0, . . . , 321-N, each of the plurality of banks 321-0, . . . , 321-N including a plurality of subarrays 325-0, . . . , 325-N of memory cells, and a bank arbiter 345 coupled to the plurality of banks 321-0, . . . , 321-N. In some embodiments, the bank arbiter 345 can include a power budget register 347 configured to allow a threshold number of available concurrent data transfers within the plurality of banks 321-0, . . . , 321-N.

As an additional non-limiting example, if the power budget register 347 is configured to allow no more than five banks to perform respective operations concurrently and three banks are ready to perform their respective operations, the power budget register 347 will allow the three banks to perform their respective operations. If three additional banks are prepared to perform operations while the first three banks are still performing operations, the power budget register 347 will deny the respective operations to the second three banks until at least one of the first group of banks has completed a respective operation. That is, the power budget register 347 can be configured such that no more than the allotted number of banks can be performing respective operations concurrently. As will be appreciated by those in the art, the power budget register 347 can provide power coordination by limiting the number of subarrays 325, 326, 327, etc. in addition to or in lieu of bank power coordination via the banks 321-0, . . . , 321-7. That is, in at least one embodiment, the power budget register 347 can, via the respective subarray budget registers 359-0, . . . , 359-7, control a number of subarrays that can perform respective concurrent operations.

In at least one embodiment, a method for bank power coordination can include concurrently performing a memory operation by a threshold number of subarrays and executing a command cause a power budget register to perform a bank power coordination operation associated with the memory operation. In some embodiments, the method can further include providing a counter having a value representing the threshold number of subarrays to concurrently perform the respective memory operation. The method can also include decrementing a counter corresponding to the threshold number of subarrays while performing the operation associated with a subarray among a plurality of subarrays. In some embodiments, the method can include incrementing a counter corresponding to the threshold number of subarrays when the operation associated with a subarray among the plurality of subarrays is completed. In some embodiments, the method can further include setting the threshold number of subarrays to concurrently perform the respective operation based at least in part on a threshold power consumption value. In addition, as described herein, executing the command can be in association with a processing in memory (PIM) device and/or the power budget register operation can be performed based at least in part on the threshold number of subarrays.

In at least one embodiment, an apparatus for bank power coordination can include an array of memory cells, sensing circuitry coupled to the array, and a bank arbiter including a register coupled to the controller. In at least one embodiment, the sensing circuitry can include a sense amplifier and a compute component configured to implement logical operations, the controller can be configured to execute a command to cause a register to perform a power budget operation, and the register is configured to control a threshold number of subarrays that can concurrently perform a subarray operation.

In some embodiments, the apparatus can include a counter associated with at least one of the number of subarrays, wherein the counter is configured to decrement based on a subarray among the number of subarrays performing a subarray operation. The counter can be configured to increment upon completion of the subarray operation. In some embodiments, the controller can be configured to execute a command to cause the register to assign a threshold amount of power to be consumed by the concurrently performed subarray operations, execute the command to cause the register to perform the power budget operation based at least in part on a number of banks accessed by the bank arbiter, and/or execute the command to cause the register to perform the power budget operation based at least in part on the threshold number of subarrays within a bank.

In at least one embodiment, a method for bank power coordination can include receiving a command at a controller on a memory device, providing a counter corresponding to a threshold number of banks to concurrently perform an operation, decrementing the counter while performing the operation associated with a particular bank among a plurality of banks, and incrementing the counter upon completing associated with the particular bank among the plurality of banks. In at least one embodiment, the plurality of subarrays and the register can be associated with a processing in memory (PIM) device.

In some embodiments, the method can include denying the operation associated with the particular bank among the plurality of banks based on the counter having a value of zero. The counter can be associated with the bank arbiter, and the bank arbiter can control the threshold number of banks to concurrently perform the memory operation. In some embodiments, the counter can be associated with the register, for example, a power budget register, and the register can be coupled to the bank arbiter and configured to control the threshold number of banks to concurrently perform the memory operation.

The method can further include denying the operation associated with the particular subarray among the plurality of subarrays based on the threshold number associated with the counter being exceeded. In some embodiments, the counter can be associated with a register, for example, a power budget register. In at least one embodiment, the plurality of subarrays and the register can be associated with a processing in memory device as described herein.

As described herein, bank power coordination can include selecting a number of banks among a plurality of banks to perform a respective memory operation, wherein the number of selected banks is less than a total number of the plurality of banks, and performing the respective memory operation on each of the selected banks, wherein the number of banks selected is controlled by a bank arbiter coupled to the plurality of banks. In some embodiments, the method can include decrementing a counter associated with the number of selected banks in response to a respective bank among the number of banks performing a respective memory operation, and/or incrementing the counter in response to the respective bank completing the respective memory operation.

In at least one embodiment, bank power coordination can be provided by an apparatus including a first number of subarrays associated with a first bank, a second number of subarrays associated with a second bank, and a bank arbiter coupled to the first bank and the second bank. In at least one embodiment, the bank arbiter can control a threshold amount of power available to perform a memory operation by at least one of the first number of subarrays, the first bank, the second number of subarrays, and the second bank. In some embodiments, the memory can include a register coupled to the bank arbiter. In at least one embodiment, the register can allocate a threshold amount of power available to perform a memory operation by at least one of the first number of subarrays, the first bank, the second number of subarrays, and the second bank.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first number of subarrays within a first memory region;
a second number of subarrays within a second memory region; and
a bank arbiter coupled to the first memory region and the second memory region, the bank arbiter to control a threshold amount of power available to perform a memory operation, the threshold amount of power available being based on at least one of the first number of subarrays, the second number of subarrays, or any combination thereof.

2. The apparatus of claim 1, further comprising a register coupled to the bank arbiter, wherein the register is to allocate the threshold amount of power available to perform the memory operation by at least one of the first number of subarrays, the first memory region, the second number of subarrays, or the second memory region, or any combination thereof.

3. The apparatus of claim 1, wherein the first memory region and the second memory region each comprise a respective memory bank of a memory device.

4. The apparatus of claim 1, wherein the memory operation comprises a processing in memory operation.

5. The apparatus of claim 1, further comprising a counter coupled to the bank arbiter, wherein the counter is:
decremented in response to performance of the memory operation; and
incremented in response to completion of the memory operation.

6. The apparatus of claim 1, wherein the bank arbiter is configured to store a result of the memory operation in the first memory region or the second memory region, or both without transferring the result of the memory operation to circuitry external to a memory device that includes the first memory region, the second memory region, and the bank arbiter.

7. The apparatus of claim 1, wherein the bank arbiter is configured to control the threshold amount of power available to perform a memory operation based at least in part on a quantity of the first memory regions and a quantity of the second memory regions accessed by the bank arbiter.

8. A method, comprising:
controlling, by a bank arbiter coupled to a first memory region comprising a first number of subarrays and a second memory region comprising a second number of subarrays, a threshold amount of power available to perform a memory operation, the threshold amount of power available being based on at least one of the first number of subarrays, the second number of subarrays, or any combination thereof.

9. The method of claim 8, further comprising allocating, by a register coupled to the bank arbiter, the threshold amount of power available to perform the memory operation.

10. The method of claim 8, wherein the first memory region and the second memory region each comprise a respective memory bank of a memory device.

11. The method of claim 8, wherein the memory operation comprises a processing in memory operation.

12. The method of claim 8, further comprising:
decrementing a counter coupled to the bank arbiter in response to performance of the memory operation; and
incrementing the counter in response to completion of the memory operation.

13. The method of claim 8, further comprising storing a result of the memory operation in the first memory region or the second memory region, or both without transferring the result of the memory operation to circuitry external to a memory device that includes the first memory region, the second memory region, and the bank arbiter.

14. The method of claim 8, further comprising controlling, by the bank arbiter, the threshold amount of power available to perform a memory operation based at least in part on a quantity of memory regions similar to the first memory region and a quantity of memory regions similar to the second memory region accessed by the bank arbiter.

15. A memory device, comprising:
a first number of subarrays within a first memory region;
a second number of subarrays within a second memory region;
a bank arbiter coupled to the first memory region and the second memory region, the bank arbiter to control a threshold amount of power available to perform a memory operation, the threshold amount of power available being based on at least one of the first number of subarrays, the second number of subarrays, or any combination thereof; and
a register coupled to the bank arbiter, wherein the register is to allocate the threshold amount of power available to perform the memory operation.

16. The memory device of claim 15, wherein the first memory region and the second memory region each comprise a respective memory bank of the memory device.

17. The memory device of claim 15, wherein the memory operation comprises a processing in memory operation.

18. The memory device of claim 15, further comprising a counter coupled to the bank arbiter, wherein the counter is:
decremented in response to starting performance of the memory operation; and
incremented in response to completion of the memory operation.

19. The memory device of claim 15, wherein the bank arbiter is configured to store a result of the memory operation in the first memory region or the second memory region, or both without transferring the result of the memory operation to circuitry external to a memory device that includes the first memory region, the second memory region, and the bank arbiter.

20. The memory device of claim 15, wherein the bank arbiter is configured to control the threshold amount of power available to perform a memory operation based at least in part on a quantity of regions similar to the first memory regions and a quantity of memory regions similar to the second memory region accessed by the bank arbiter.

* * * * *